US011276603B2

(12) United States Patent
Choi et al.

(10) Patent No.: US 11,276,603 B2
(45) Date of Patent: Mar. 15, 2022

(54) TRANSFER METHOD USING DEFORMABLE FILM

(71) Applicant: LC SQUARE CO., LTD., Gyeonggi-do (KR)

(72) Inventors: Je Hyuk Choi, Gyeonggi-do (KR); Chang Wan Kim, Gyeonggi-do (KR); Chan Soo Shin, Gyeonggi-do (KR); Hyeong Ho Park, Daejeon (KR); Shin Keun Kim, Gyeonggi-do (KR)

(73) Assignee: LC SQUARE CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/907,697

(22) Filed: Jun. 22, 2020

(65) Prior Publication Data

US 2020/0321234 A1 Oct. 8, 2020

Related U.S. Application Data

(63) Continuation of application No. PCT/KR2018/016293, filed on Dec. 20, 2018.

(30) Foreign Application Priority Data

Dec. 22, 2017 (KR) .................... 10-2017-0178701

(51) Int. Cl.
*H01L 21/683* (2006.01)
*H01L 23/00* (2006.01)
(Continued)

(52) U.S. Cl.
CPC .......... *H01L 21/6835* (2013.01); *H01L 24/96* (2013.01); *H01L 25/0753* (2013.01);
(Continued)

(58) Field of Classification Search
CPC . H01L 21/6835; H01L 24/96; H01L 25/0753; H01L 25/16; H01L 25/167;
(Continued)

(56) References Cited

U.S. PATENT DOCUMENTS 7,943,491 B2    5/2011  Nuzzo et al.
8,211,320 B2 *  7/2012  Pei ..................... B82Y 30/00
                                                        216/11
(Continued)

FOREIGN PATENT DOCUMENTS

JP    2008-166757    7/2008
JP    2009-152387    7/2009
(Continued)

OTHER PUBLICATIONS

International Search Report and Written Opinion for International Application PCT/KR2018/016293, dated Apr. 4, 2019.

*Primary Examiner* — Vu A Vu
(74) *Attorney, Agent, or Firm* — Burris Law, PLLC

(57) ABSTRACT

A transfer method of transferring an object to a target substrate by using a deformable film is provided. The method includes: a first process of forming an object on a source substrate, a second process of placing a deformable film on the source substrate on which the object is formed, a third process of embedding the object into the deformable film, a fourth process of separating an object, which is to be transferred, from the source substrate, integrating the transfer object in or on a surface of the deformable film, and separating deformable film, in which the transfer object is integrated, from the source substrate, and a fifth process of transferring the object integrated into the deformable film to a target substrate.

23 Claims, 11 Drawing Sheets

(51) Int. Cl.
*H01L 25/075* (2006.01)
*H01L 25/16* (2006.01)
*H01L 33/00* (2010.01)

(52) U.S. Cl.
CPC ............ *H01L 25/16* (2013.01); *H01L 25/167* (2013.01); *H01L 33/0093* (2020.05); *H01L 2221/68345* (2013.01); *H01L 2221/68368* (2013.01)

(58) Field of Classification Search
CPC ....... H01L 33/0093; H01L 2221/68345; H01L 2221/68368; H01L 33/0095; H01L 2221/68322; H01L 2221/68354; H01L 2221/68381; H01L 21/306; H01L 21/3213; H01L 21/027; H01L 27/156; H01L 21/30604; B41M 1/30; B41M 3/12; B44C 1/16
USPC .......................................................... 438/25
See application file for complete search history.

(56) References Cited

U.S. PATENT DOCUMENTS

| | | | |
|---|---|---|---|
| 8,257,538 B2* | 9/2012 | Doi ..................... | H01L 24/82 156/241 |
| 8,546,935 B2* | 10/2013 | Mouli ................ | H01L 23/3733 257/706 |
| 9,761,754 B2* | 9/2017 | Bower ................. | H01L 21/187 |
| 2008/0020547 A1 | 1/2008 | Kostrzewa et al. | |
| 2017/0338374 A1 | 11/2017 | Zou et al. | |

FOREIGN PATENT DOCUMENTS

| KR | 10-2010-0054030 | 5/2010 |
| KR | 10-2011-0111209 | 10/2011 |
| KR | 10-2016-0087264 | 7/2016 |

* cited by examiner

TRANSFER METHOD USING DEFORMABLE FILM

CROSS-REFERENCE OF RELATED APPLICATIONS

This application is a continuation of PCT Application No. PCT/KR2018/016293, filed Dec. 20, 2018, which claims the benefit of priority to Korean Patent Application No. 10-2017-0178701, filed on Dec. 22, 2017, in the Korean Intellectual Property Office, the disclosures of which are incorporated by reference herein in their entireties.

TECHNICAL FIELD

The inventive concept relates to a transfer method of transferring objects to a target substrate, and more particularly, to a transfer method using a deformable film of simultaneously or selectively transferring objects, which respectively have different types and functions, to the target substrate by integrating the objects in the deformable film and delivering the objects to the target substrate.

BACKGROUND

Recently, electric and electronic technologies have been rapidly developing, and research into convergence technologies of various technologies having different technical characteristics have been increasing in accordance with the needs of new times and the needs of various consumers.

With respect to objects (devices, materials) manufactured based on these different technologies, a transfer technology capable of respectively manufacturing the objects on original substrates (source substrates and temporary substrates) and deliver the objects onto a final target substrate (a target substrate) without damage and performing integration is very important, for example, forming an epitaxial layer of a semiconductor device.

A pattern transfer technology using a stamp made of an elastomer material (U.S. Pat. No. 7,943,491) may be a typical example of various transfer technologies.

The existing technology is to manufacture a device on a source substrate (a native substrate), decrease an adhesive force between the source substrate and the device by a process such as wet etching, and perform pick-and-place by using an elastomer stamp and a difference in adhesive forces according to pick-up speed.

The technology is for integrating different devices having various sizes, shapes, or materials (silicon, GaN, graphite, etc.) on one same substrate.

Another existing technology is the electrostatic head method of Luxvue. The method is to decrease adhesive force between a micro LED (light-emitting diode) chip and a source substrate by increasing a temperature of the source substrate, and then perform pick-and-place on the LED chip by using electrostatic force that is generated by applying a voltage to a silicon head on which an electrode is formed.

A micro LED-based display manufacturing technology will be described as an example to describe the existing transfer technology in detail.

A micro LED refers to an LED having a size of 100 µm×100 µm or less, and is applied to a backlight light source, a display light source, a full color display, a flat display device, and the like. Recently, a micro LED has been used in various fields (hereinafter, referred to as "objects using a micro LED) such as electricity, electronic material and devices, including a next-generation display such as a wearable device, a flexible device, a smart watch, a smart fiber, or a head-mounted display (HMD), bio, and optical communication.

For example, in order to implement a full color display by using a micro LED, individual LEDs respectively emitting different wavelengths of red, green, and blue are required, and as an emission wavelength varies according to a semiconductor band gap, it is required to use micro LED devices respectively having different band gaps.

Generally, a blue LED is GaN-based, and a green LED is GaN-based In which a band gap is adjusted by changing a composition ratio of a material having a quantum well structure in a light emitting region, and a red LED is GaAs-based.

To manufacture LEDs respectively having different band gaps, semiconductor epitaxial layers having different band gaps are grown by using a metal-organic chemical vapor deposition (MOCVD) apparatus on different substrates for each wavelength, such as a sapphire substrate or a GaAs substrate, and red, blue, and green LED devices are manufactured.

To apply a micro LED as a display pixel, a technology of mass transfer and integration of red, green, and blue micro LED device arrays, which are manufactured on different substrates by using different materials, at a high speed to a target substrate for a display is required.

This kind of process of quickly and accurately transferring the micro LED chip arrays to the target substrate is the greatest technical obstacle in commercialization of a full color display using the micro LEDs.

A public display, which uses existing LED chips having a relatively great size (up to 300 µm×300 µm), has used a pick-and-place method such as transferring using a surface mounter technology (SMT) apparatus and transporting the LEDs to a die bonder. However, the existing transfer apparatus and technology may not easily pick up micro LED chips having small sizes, the apparatus is not accurate enough to accurately transfer the micro LED chips to a target substrate, and as the technology is basically for transferring a single LED chip, the technology is not appropriate for a display by using micro LEDs that require transfer in a large amount such as dozens to millions of micro LED chips at a high speed.

In order to overcome the limitation in the existing transfer technology, Luxvue introduced a transfer technology using electrostatic force, and X-Celeprint is on the way of developing a micro LED display technology by using a pattern transfer technology using a stamp that includes an elastomer material.

Among the technologies, the transfer technology using electrostatic force of Luxvue is a technology including: growing a semiconductor film for LEDs on a primary substrate, transferring the grown semiconductor film to a secondary substrate by using a wafer boding process and a Laser-lift-off (LLO) process, and manufacturing a micro LED device. The transfer technology includes decreasing adhesive force of a bonding material between the micro LED device and the secondary substrate by increasing a temperature of the secondary substrate, applying a voltage to a silicon head on which an electrode manufactured by a micro-electro mechanical systems (MEMS) process is patterned and bring the silicon head into contact with an upper portion of the micro LED device, picking up the LED device by using electrostatic force generated by the contact, and placing the LED device on a final target substrate for a display.

The technology is capable of only sorting and transferring selected devices or arrays, but needs two transfer processes of transferring a semiconductor thin film for a micro LED on a secondary substrate (a temporary substrate) and manufacturing a micro LED device and transferring the micro LED device to the target substrate, and the micro LED device may be damaged during the LLO process.

Furthermore, as electrostatic force is used when picking up the micro LED, the micro LED device may be damaged by an electrostatic charge, and there is an inconvenience of separately manufacturing a silicon head for generation of the electrostatic force by using the MEMS process.

Next, in the pattern transfer technology of X-Celeprint using a stamp made of an elastomer material, first, in the case of a red micro LED, an epitaxial layer including a lower sacrificial layer is grown on a GaAs substrate, micro LED devices are manufactured by a semiconductor process, and then individual devices are fixed with anchors by using a photolithography process and photoresist. When the device is separated from the substrate by performing wet etching on the lower sacrificial layer of the fixed micro LED device, the micro LED device is separated from the substrate but is maintained fixed by the anchor, and then, an upper portion of the micro LED device is in contact with the stamp formed of an elastomer material, and the micro LED device is picked up and placed on the target substrate.

In the case of blue and green micro LEDs, first, GaN-based LED devices are manufactured on a primary sapphire substrate, the micro LED devices are delivered to a secondary substrate by using a wafer bonding process and LLO process, and then, adhesive force between the micro LED devices and the secondary substrate is decreased by using a wet etching process, and next, upper portions of the micro LED devices are in contact with the stamp including an elastomer material, and the micro LED devices are picked up and placed on the target substrate.

This method has the inconvenience of delivering from the primary substrate to the secondary substrate, and therefore, a technology as an improved method has been developed as follows: a GaN-based LED device is manufactured on the primary substrate (Si) by using the GaN-on-Si epitaxial growth technology, the micro LED device is fixed by an anchor including an insulator, lower Si is removed by a wet etching process and the GaN-based micro LED device on an upper portion is maintained separated from the substrate, and then, an upper portion of the micro LED device is in contact with a stamp including an elastomer material, and the micro LED device is picked up and placed on the target substrate.

In the case of this technology, although the transfer process to the secondary substrate is removed and the number of processes is decreased, there is still the disadvantage that the GaN-based LED is mainly manufactured on a sapphire substrate and the performance of an LED epitaxial layer in the GaN— on-Si-based LED technology is still inferior to the performance of epitaxial layers for an LED grown on sapphire due to many disadvantages such as a lattice constant and a difference between thermal expansion coefficients between GaN and Si.

As described above, by using a pattern transfer using a stamp formed of an elastomer material, X-Celeprint integrated red, green, and blue micro LED devices formed of different materials on a single substrate, and thus, implemented and introduced the micro LED devices as displays.

SUMMARY

The inventive concept is derived by the necessity of a new transfer technology and provides a transfer method using a deformable film, the method of transferring different kinds of or different production-based objects to a target substrate in an array form or a single form by using the deformable film.

To achieve the technical goal, the inventive concept includes a transfer method using a deformable film, the method including: a first process of forming objects on a source substrate; a second process of placing a deformable film on which the objects are formed; a third process of embedding the objects in the deformable film; a fourth process of separating an object (referred to as a "transfer object" hereinafter), which is to be transferred, from the source substrate, integrate the transfer object in or on a surface of the deformable film, and separate the deformable film, in which the transfer object is integrated, from the source substrate; and a fifth process of transferring the object, which is integrated into the deformable film, to a target substrate.

In addition, the deformable film is deformed by light, heat, or pressure, and is preferably formed of a material allowing control of the degree of deformation or the number of deformations.

Furthermore, in the third process, it is desirable to selectively specify the transfer object among the objects formed on the source substrate.

In addition, after a first target object is integrated into the deformable film, it is preferable that the second through fourth processes are repeatedly executed and an object is additionally embedded in the deformable film, in which the first transfer object is integrated, and a second transfer object, a third transfer object, ... and an $n^{th}$ transfer object are additionally integrated in different positions, respectively.

Here, it is desirable that the deformable film is deformed to correspond to a shape of the additional embedding object or additional integration object in the additional embedding process.

Furthermore, when an embedding pattern is formed in the deformable film by the non-transferred object, it is desirable that an additional embedding object or an additional integration object is embedded at a position, in which the embedding pattern is formed, or a position adjacent thereto.

In addition, when an embedding pattern is formed in the deformable film by the non-transferred object, it is desirable that the embedding pattern, in the additional embedding process, is deformed to correspond to the form of the additional embedding object or the additional integration object.

Furthermore, it is desirable that the additional integration objects are of one same kind, or different from one another in any one of size, material, function, and shape, and integrated into the deformable film in a single form or an array form.

Furthermore, it is desirable that an anti-stiction process is performed on a contact surface between the source substrate and the deformable film.

In addition, it is desirable that the fourth process includes separating the object from the source substrate by a Laser-lift-off or a Chemical-lift-off method.

Here, it is desirable that the object, which is not transferred from the source substrate to the target substrate, is excluded in the laser-lift-off process or a protection film having resistance to wet etching surrounds the non-transferred object.

Furthermore, it is desirable that a sacrificial layer is formed between the object and the source substrate.

In addition, it is desirable that the transfer object has a structure that is separable from the source substrate.

Furthermore, it is desirable that the sacrificial layer is formed between the object and the source substrate, a portion of the transfer object among the objects are fixed to the source substrate by an anchor, and the transfer object forms a freestanding structure or an undercut structure with respect to the source substrate by wet etching.

In addition, it is desirable that the object includes a structure including at least one of silicon, monocrystalline silicon, polycrystalline silicon, doped silicon, N-type silicon, P-type silicon, indium (In)-gallium (Ga)-aluminum (Al)-nitrogen (N), In—Ga—Al-arsenic (As) (lead (P), antimony (Sb)), SiC, $Ga_2O_3$, graphite, and silica.

In addition, it is desirable that the object includes at least one or a combination of at least two of an electronic device, an optical device, a sensor device, a diode, a transistor, a photovoltaic device, a laser, a P-N junction, a nano device, an MEMS device, a nano material, a quantum dot, or a nano line, or provided in the form of an array thereof.

Furthermore, it is desirable that the degree of curing or the degree of deformation of the deformable film is controlled by light, heat or pressure.

In addition, in the third process, it is desirable that an embedding depth is adjustable by adjusting a pressure when the object is embedded, and adhesive force between the target substrate and an object delivered thereto is adjusted according to the embedding depth.

In addition, it is desirable that the deformable film is formed on a support substrate and placed on the source substrate or formed by laminating or coating on the source substrate.

Furthermore, it is desirable that the target substrate includes any one of a semiconductor substrate, a polymer substrate, glass, metal, paper, and an insulator.

In addition, it is desirable that the target substrate in the fifth process is coated or laminated on the deformable film.

Here, it is desirable that an adhesion layer is further formed on the target substrate or a delivery surface of the object.

After the fifth process, it is desirable that a passivation layer is further formed on the target substrate, to which the object is transferred, or an electrode forming process for driving or connection with an external circuit of the object transferred on the target substrate is further formed.

The inventive concept is a technology of transferring objects having single or different shapes, materials, and functions to a target substrate in a mass-array form or a single object form, and may be useful for manufacturing a fusion device that is capable of simultaneously performing various functions.

In particular, the inventive concept uses a deformable film to embed an object in the deformable film, integrate a transfer object and deliver the transfer object to a target substrate, and as a bonding process and separation process on a separate temporary substrate are not required, the cost and time for the process are saved by simplification of processes.

In addition, objects of different kinds or different production-bases are easily transferred to the target substrate, and only a specific object or an array of specific objects may be easily selected and transferred to the target substrate, and therefore, the inventive concept may be applied to various fields.

In particular, by integrating in the deformable film and delivering to the target substrate, the object may be quickly and accurately transferred to the target substrate in a uniform spatial arrangement, and the target object may be quickly transferred without being damaged, and therefore, may be very effectively applied to mass transfer of a micro semiconductor device, such as a micro LED array, and is expected to contribute to the application fields and commercialization expansion.

BRIEF DESCRIPTION OF DRAWINGS

FIG. 1 illustrates a first embodiment of a transfer method using a deformable film according to embodiments of the present disclosure.

FIG. 2 illustrates a second embodiment of a transfer method using a deformable film according to embodiments of the present disclosure.

FIG. 3 illustrates a third embodiment of a transfer method using a deformable film according to embodiments of the present disclosure.

FIG. 4 illustrates a fourth embodiment of a transfer method using a deformable film according to embodiments of the present disclosure.

FIG. 5 illustrates a fifth embodiment of a transfer method using a deformable film according to embodiments of the present disclosure.

FIG. 6 illustrates a mimetic diagram of a process of transferring only semiconductor devices in a specific region, among the same kind of semiconductor devices, to a target substrate, according to an example embodiment of the present disclosure.

FIG. 7 is a mimetic diagram of a process of transferring semiconductor device of another type to a target substrate, according to an example embodiment of the present disclosure.

FIG. 8 is a mimetic diagram of a process of transferring semiconductor device having another production-base to a target substrate, according to an example embodiment of the present disclosure.

FIG. 9 is a mimetic diagram of a process of transferring semiconductor devices, which have different production-bases, to a target substrate, according to an example embodiment of the present disclosure.

FIG. 10 illustrates a source substrate, a deformable film, and a target substrate in the embodiment according to FIG. 3.

FIG. 11 illustrates a source substrate, a deformable film, and a target substrate in the embodiment according to FIG. 4.

DETAILED DESCRIPTION OF EMBODIMENTS

Figure 1:
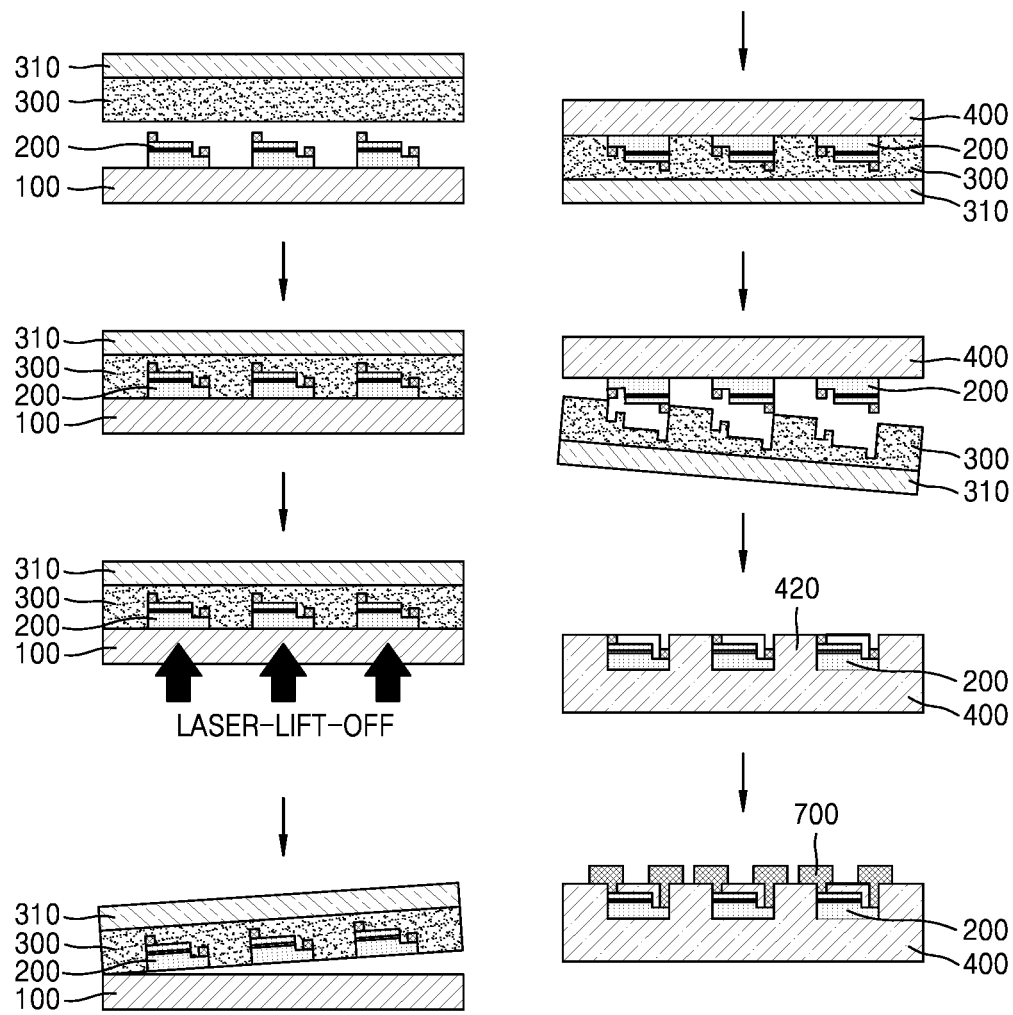
FIGS. 1 through 11 are mimetic diagrams of various embodiments of the inventive concept as follows.

The inventive concept relates to a transfer method of transferring an object to a target substrate, by embedding the object in a deformable film, integrating and delivering the object to the target substrate, to transfer various sizes of objects of single or different types and materials and having different functions to the target substrate in a mass array form or a single object form.

By doing so, a bonding process and a separation process to a separate temporary substrate is not needed, and the cost and time for processes are saved by the simplification of processes, a spatial arrangement of the transferred object may be uniformly maintained, and the object such as a semiconductor device and an array of the objects may be accurately transferred with high efficiency.

Hereinafter, the inventive concept will be described in detail with reference to the accompanying drawings. FIGS. 1 through 5 are mimetic diagrams of a transfer method using a deformable film according to various embodiments of the inventive concept.

As it is shown, the transfer method includes: a first process of forming objects on a source substrate 100 according to the inventive concept; a second process of placing a deformable film 300 on the source substrate 100 on which the objects are formed; a third process of embedding the objects in the deformable film 300; a fourth process of separating the object (hereinafter, referred to as a "transfer object"), which is to be transferred, from the source substrate 100 and integrating the transfer object in or on a surface of the deformable film 300 and separating the deformable film 300, in which the transfer object is integrated, from the source substrate 100; and a fifth process of delivering the target object, which is integrated into the deformable film 300, to a target substrate 400.

The object 200 in the inventive concept indicates any kinds of structures on the source substrate 100 that may be transferred onto a surface of the substrate 400, indicates a pattern of the structures or an array thereof, and includes a nanostructure pattern, a microstructure pattern, or both of the nanostructure pattern and the microstructure pattern.

For example, the object includes a semiconductor including at least one of silicon, monocrystalline silicon, polycrystalline silicon, doped silicon, N-type silicon, P-type silicon, indium(In)-gallium(Ga)-aluminum(Al)-nitrogen(N), In—Ga—Al-arsenic(As) (lead(P), antimony(Sb)), SiC, Ga$_2$O$_3$, graphite, and silica.

Specifically, the object includes one or a combination of at least two of an electronic device, an optical device, a sensor device, a diode, a transistor, a photovoltaic device, a laser, a P-N junction, a nano device, an MEMS device, a nano material, a quantum dot, and a nanowire, or includes the electric and electronic devices provided in single, plural, or combinations thereof, or a device provided as an array thereof. In addition, such an array device may include a form in which circuits are printed and electrically connected to one another for operation.

That is, a single type of object may be provided in plural, or different types of objects or different production-based objects may be combined to exhibit performance.

In addition, an object (hereinafter, referred to as a "transfer object") to be transferred from the source substrate 100, among the objects, has a structure that is separable from the source substrate 100.

That is, the transfer object is formed of a structure that easily absorbs energy for separation in a separation process (the fourth process) from the source substrate 100 to be described later, or the transfer object is formed in a smaller degree of combination or attachment to the source substrate 100 than a non-transferred object, such that the transfer object may be easily separated from the source substrate 100 in the separation process (the fourth process) to be described later.

The above-described structure that easily absorbs energy for separation from the source substrate 100 is formed in a structure having laser energy concentrated between an object to be separated and the source substrate 100 for a separation process such as laser lift off.

In addition, when the degree of combination or attachment to the source substrate 100 is less than to the non-transferred object, for example, for a separation process such as Chemical-lift-off, a sacrificial layer may be formed between the object and the source substrate 100, or the transfer object may be arranged in a freestanding structure or an undercut structure.

Here, for implementation of the freestanding structure or undercut structure, a sacrificial layer 500 is formed between the object and the source substrate, a portion of the transfer object among the objects is fixed to the source substrate 100 by an anchor 250, and thus, by wet etching, the transfer object forms the freestanding structure or undercut structure with respect to the source substrate 100 by the anchor.

Figure 6:
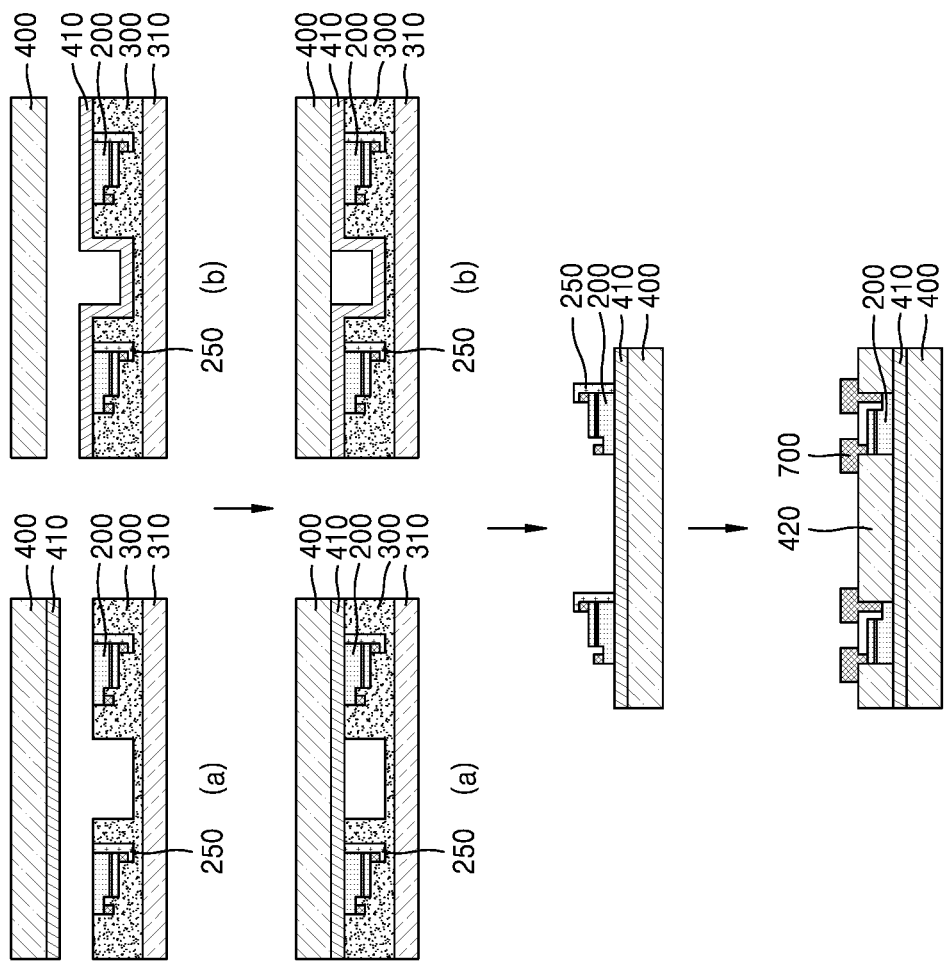
Figure 6:
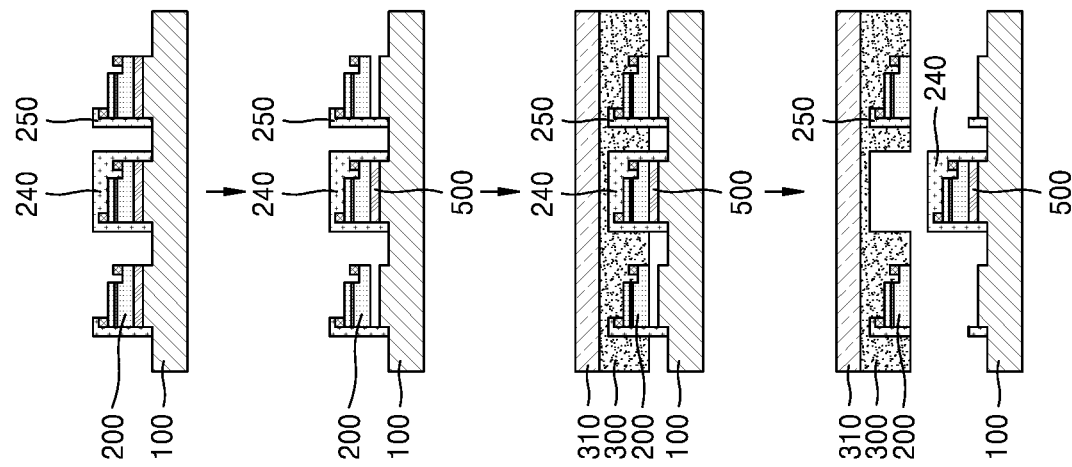

In other words, the sacrificial layer 500 and the anchor 250 are formed on the transfer object, and by performing wet etching on the sacrificial layer 500 and the anchor 250, the sacrificial layer is removed, but the transfer object is temporarily fixed on the source substrate 100 by the anchor 250. (FIG. 6)

To be temporarily fixed means the degree of combination or attachment is small, or a state of being physically separated from the source substrate 100 but fixed to the source substrate 100 by the anchor 250.

The anchor 250 connects a portion of the transfer object to the source substrate 100 by photoresist or resin having resistance by wet etching, and in a wet etching or embedding process, the transfer object is fixed to the source substrate 100. However, by a force strong enough to separate the deformable film 300, as the anchor 250 is fractured, the transfer object is separated from the source substrate 100.

The anchor provides physical support enough to prevent deformation of a position of the transfer object even by embedding by using the deformable film 300, thereby preventing distortion of the position of the transfer object in the embedding process.

The inventive concept relates to a method of having the object 200 embedded in the deformable film 300, separated from the source substrate 100, simultaneously, selectively, or sequentially integrated into or on the surface of the deformable film 300, and delivered and transferred to the target substrate 400, and a case in which the object is a semiconductor or semiconductor device will be explained as an example embodiment of the inventive concept.

The semiconductor includes a device semiconductor such as silicon, germanium, and diamond, for example, a Group IV compound semiconductor such as SiC and SiGe, a Group III-V semiconductor such as AlSb, AlAs, AlN, AlP, BN, GaSb, GaAs, GaN, GaP, InSb, InAs, InN, InP, and alloys thereof, a Group II-VI semiconductor such as CsSe, CdS, CdTe, ZnO, ZnSe, ZnS, and ZnTe, a Group I-VII semiconductor such as CuCl, a Group IV-VI semiconductor such as Pbs, PbTe, and SnS, a layer semiconductor such as PbI$_2$, MoS$_2$, and GaSe, and an oxide semiconductor such as Ga$_2$O$_3$, CuO, and Cu$_2$O.

Furthermore, to provide electrical characteristics useful for given applications or apparatuses, the semiconductor includes an intrinsic semiconductor and impurity semiconductors doped with at least one material including a semiconductor having a p-type doping material and an n-type doping material.

The semiconductor includes Si, Ge, SiC, AlP, AlAs, AlSb, GaN, GaP, GaAs, GaSb, InP, InAs, GaSb, InP, InAs, InSb, ZnO, ZnSe, ZnTe, CdS, CdSe, ZnSe, ZnTe, CdS, CdSe, CdTe, HgS, PbS, PbSe, PbTe, AlGaAs, AlInAs, AlInP, GaAsP, GnInAs, GaInP, AlGaAsSb, AlGaInP, and GaInAsP.

Hereinafter, an example of a micro light-emitting device (LED) among semiconductor devices using the semiconductor will be mainly described.

First, the semiconductor device 200 is formed on the source substrate 100.(a first process)

The source substrate 100 in the inventive concept may refer to as a growth substrate for growing the semiconductor device 200 such that the characteristics of the semiconductor device 200 are best expressed.

For example, for implementing a blue LED, a buffer layer is formed on a sapphire substrate and an epitaxial layer (GaN-based) for emitting blue or green light is grown; and for implementing a red LED, a buffer layer is formed on a GaAs substrate and an epitaxial layer (GaAs-based) for emitting red light is grown. A preset substrate such as the sapphire substrate or GaAs used for growing the epitaxial layer is referred to as the source substrate 100.

In the related art, semiconductor devices have been formed on these source substrates and used. However, as source substrates are limited in types and commercialization in various fields due to relatively high price, in the inventive concept, the semiconductor device 200 is formed to exhibit most appropriate characteristics of the semiconductor device 200 on the source substrate 100 and transfer the semiconductor device 200 to a desired target substrate 400 and allows application in various fields.

One of sapphire ($Al_2O_3$), silicon (Si), gallium arsenide (GaAs), gallium phosphide (GaP), gallium arsenide phosphide (GaAsP), SiC, GaN, AlN, ZnO, and MgO, and a semiconductor device including a nitride-based semiconductor layer or a GaAs-based semiconductor layer may be used as the semiconductor device 200.

For example, in the case of the micro LED, the nitride-based semiconductor layer is used for implementing blue light and green light, and in the case of the micro LED, the GaAs-based semiconductor layer is used for implementing red light. The micro LED may be provided in a state of having an electrical connection circuit printed thereon.

A sacrificial layer 500 may be formed between the substrate 100 and the semiconductor device 200 such that the semiconductor device 200 is easily separated from the source substrate 100.

Next, the deformable film 300 is placed on the source substrate 100 on which the semiconductor device 200 is formed.(a second process)

The deformable film 300 is formed of a flexible material to embed the semiconductor device 200 and fix it to a certain extent for integration, and is formed of a material deformed by light or heat, a material deformed by light and pressure or heat and pressure, or a material deformed only by pressure, that is, a material that allows the degree of deformation and the number of deformations.

That is, the deformable film 300 according to the inventive concept basically includes a material that is freely deformed by light, heat, and pressure by an additional embedding process and additional integration process, and it is preferable that the deformable film 300 includes a thermoplastic or light-plastic resin. However, a thermoplastic or light-plastic resin, which may undergo a partial curing process, may be used depending on needs.

In addition, the deformable film 300 may have the form of a film, provided in a fluid state and placed above the source substrate 100 on which the semiconductor device 200 is formed, or may be formed by laminating or coating.

Here, the deformable film 300 may be seated at a more accurate position on the source substrate 100, and for ease of separation of the deformable film 300, the deformable film 300 may be first formed on a support substrate 310 and then placed on the source substrate 100.

As it is preferable to stably embed the semiconductor device 200 in the deformable film 300, a greater thickness than a thickness of the semiconductor device 200 is required, and it is preferable that the thickness of the deformable film 300 is at least 100 μm or greater. However, in some cases, embedding and integration may be performed on or near the surface of the deformable film 300, and therefore, the thickness of the deformable film is appropriately adjusted and applied under a process environment.

In detail, the deformable film 300 includes a material deformed by light, heat, or pressure, and may use a material deformed to correspond to the form of the object in each additional embedding process, or a material that is partially cured in each additional embedding process and on which an embedding process may be performed by using an embedding pattern.

For example, a thermoplastic, light-plastic, thermosetting, or light-curing resin such as polyethylene, polypropylene, acryl resin, polyamide resin, polyimide, Dry film photoresist (DFR), epoxy acrylate, urethane acrylate, and polyester acrylate may be used.

As described above, the deformable film 300 according to the inventive concept is formed of a material deformed by light or heat, a material deformed by light and pressure or by heat and pressure, or a material deformed only by pressure, enables adjustment of attachment with the semiconductor device 200 that is embedded, makes the semiconductor device 200 be stably embedded in the deformable film regardless of types or weight of the semiconductor device 200, and has the semiconductor device 200 integrated and transferred to the target substrate 400.

Here, when the deformable film 300 is formed of a material that is deformed by light or heat or a thermoplastic or light-curing material that is deformed by physical force such as pressure, deformation is performed to correspond to a type of the object to be embedded or the object to be integrated, and therefore, the convenience of additional embedding processes and integration processes may be considered regardless of the type of the object.

Furthermore, the thermosetting or light-curing resin, on which first curing and second curing that cures harder may be performed, may be used depending on the type of the semiconductor device 200, and it is desirable to perform curing stably enough to integrate the semiconductor device 200 that is entirely embedded, facilitate delivery of the semiconductor device 200 to the target substrate 400, and facilitate peeling of the final target substrate 400.

That is, when the semiconductor device 200 is delivered to the target substrate 400 to be described later, the deformable film 300 according to the inventive concept enables integration sufficient to maintain a lower adhesive force compared to an adhesive force between the semiconductor device 200 and the target substrate 400 and stably fix the semiconductor device 200 that is embedded, and enables curing or deformation sufficient to easily perform peeling of the deformable film 300 when the delivery of the semiconductor device 200 to the target substrate 400 is completed.

The deformable film 300, which basically has flexibility, has an advantage that the semiconductor device 200 is quickly delivered and the deformable film 300 is easily removed as long there is a little adhesion in a peeling process after the semiconductor device 200 is delivered to target substrate 400.

Next, the semiconductor device 200 (a first semiconductor device 210) is embedded in the deformable film 300.(a third process)

As described above, the deformable film 300 formed of a material cured or deformed by light, heat, or pressure is placed on the source substrate 100 on which the semiconductor device 200 is formed, a certain pressure is applied such that the semiconductor device 200 (the first semiconductor device 210) is embedded in the deformable film 300, and the semiconductor device 200 is fixed in the embedding pattern 320 by deforming the deformable film 300 by applying light, heat or pressure.

Figure 2:
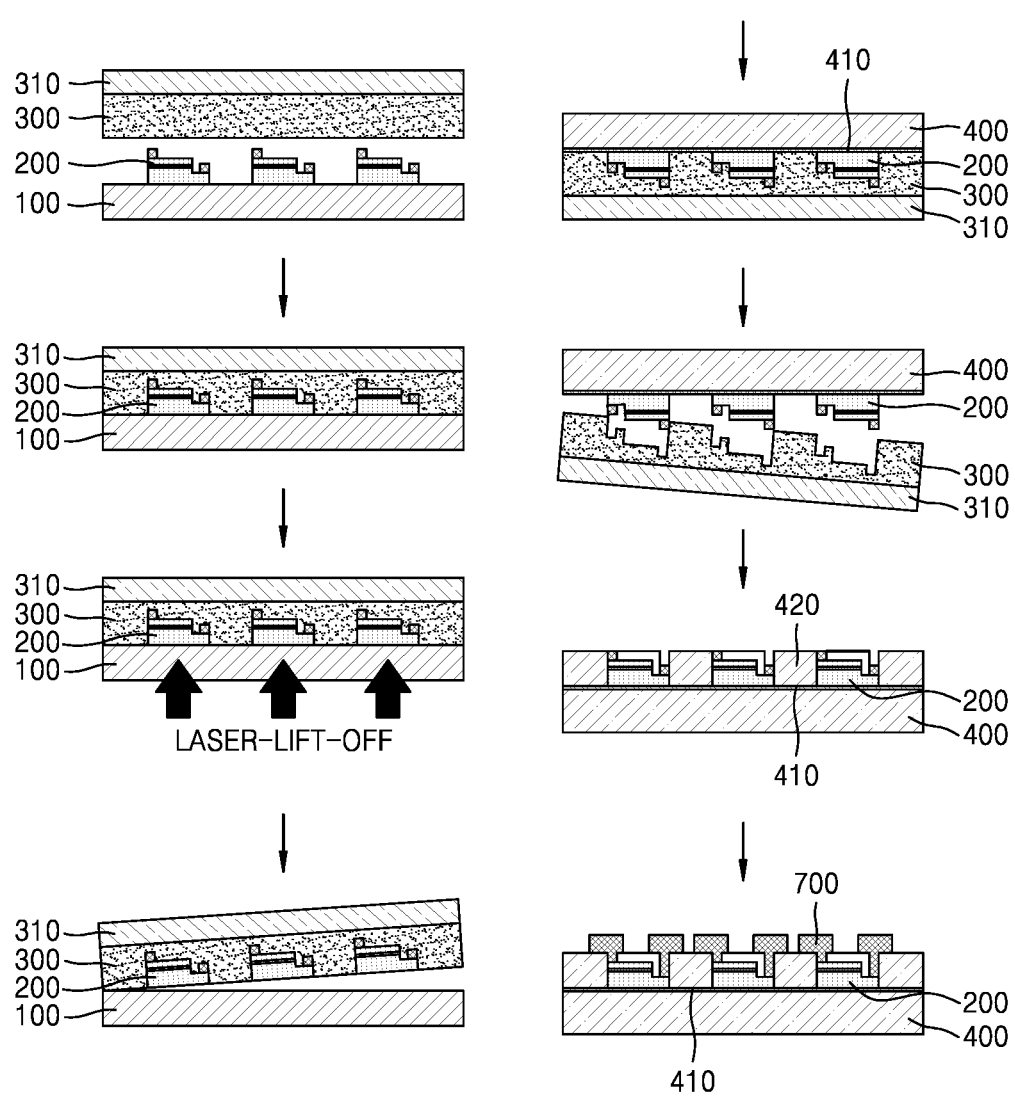

As shown in FIGS. 1 and 2, when the deformable film 300 is of a single type, arrays of the semiconductor devices 200 are simultaneously embedded and integrated into or on the surface of the deformable film 300, and then transferred onto the target substrate 400.

Figure 3:
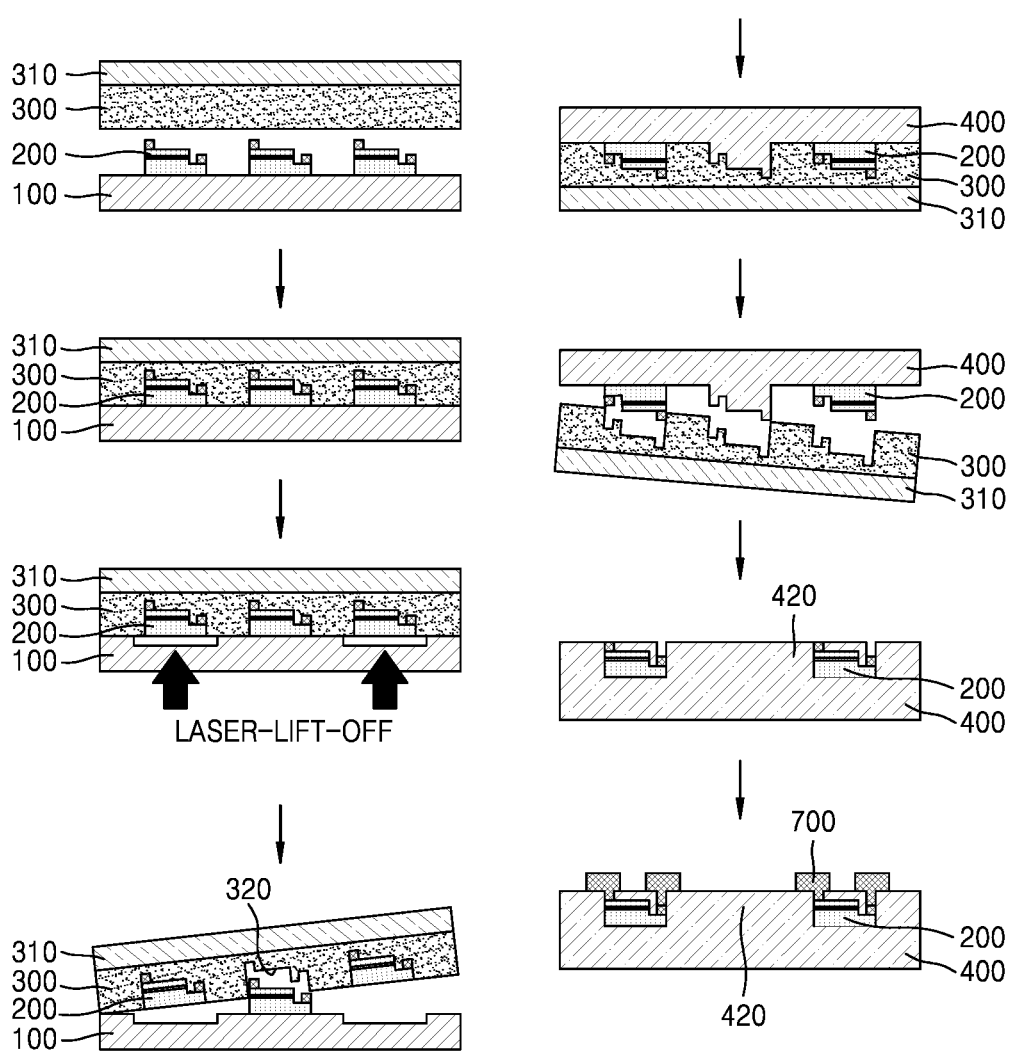

FIG. 3 shows a case of selectively specifying, integrating, and transferring the semiconductor device (a first semiconductor device) 200 in a specific region, although the semiconductor device 200 is of a single type.

Figure 4:
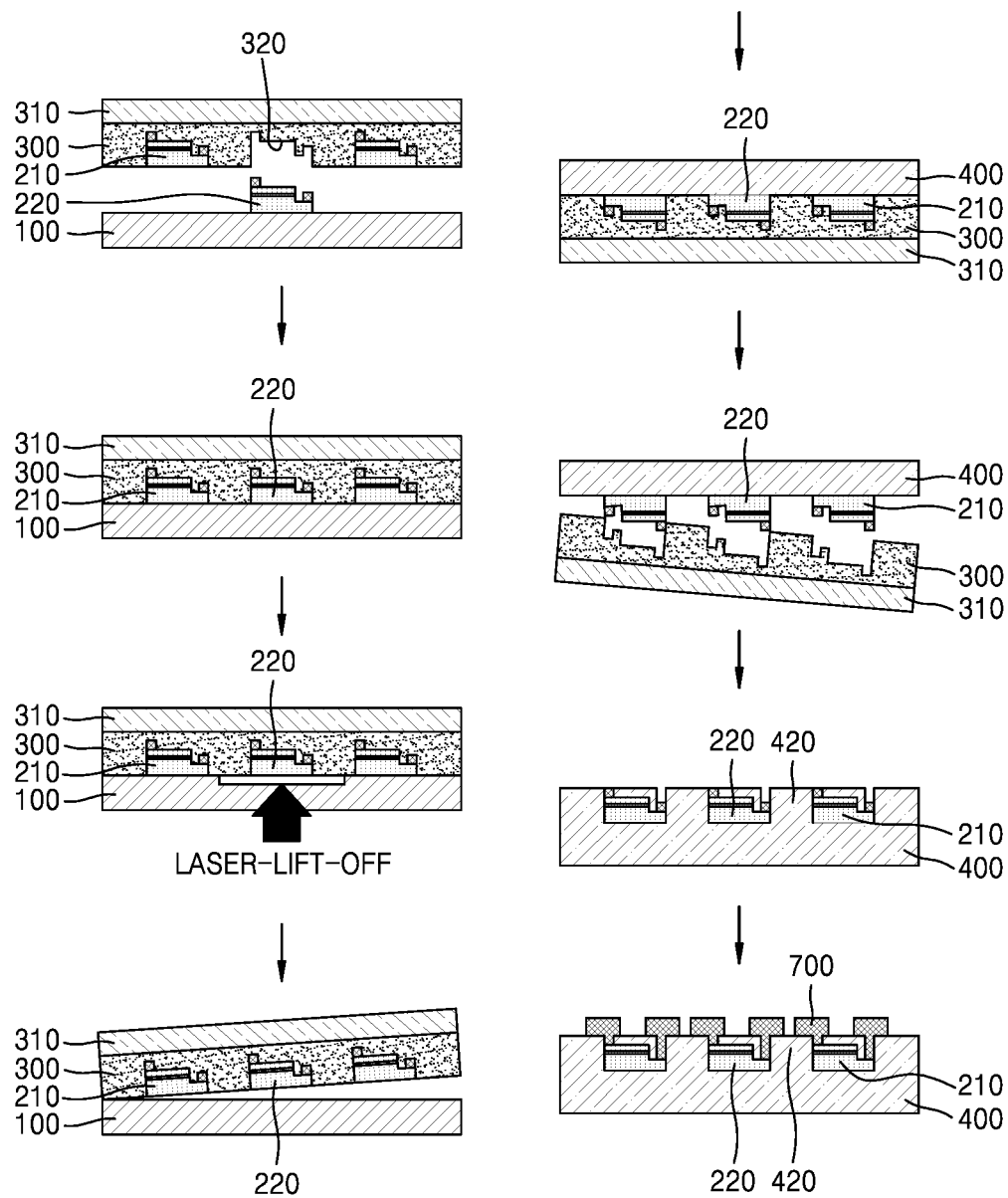

FIG. 4 shows a case of embedding and integrating a semiconductor device (a second semiconductor 220), which is different from the embedded semiconductor device (the first semiconductor device 210), at a position at which the embedding pattern 320 is or at a position adjacent thereto, in a state in which the semiconductor device 200 (transfer object) in a specific region is integrated into the deformable film 300 and the embedding pattern 320 is formed on the deformable film 300 by the semiconductor device 200 (the non-transferred object) in another region, according to FIG. 3.

In this case, depending on types of the deformable film or types of the semiconductor device, the degree of deformation or the degree of curing in an embedding process of the first semiconductor device 210 and an embedding process of the second semiconductor 220 is changed, such that additional embedding processes and additional integration processes may be smoothly performed.

In this case, according to shapes, sizes, or types of the device, in the additional embedding process, deformation is performed on the deformable film or the embedding pattern to correspond to the shape of an additional embedding object or an additional integration object.

For example, when a thermoplastic resin is used as a deformable film, even when many times of embedding processes are performed, the deformable film is deformed to correspond to the shape of the semiconductor device regardless of type of the semiconductor device, thereby enabling embedding and additional integration processes regardless of types, numbers, or array shapes of the objects, and when using the thermoplastic resin, the reason for the existence of the embedding pattern is not so important.

In addition, when a thermosetting resin is used as a deformable film, by having the degree of curing in the integration of the second semiconductor device 220 harder than the degree of curing in the integration of the first semiconductor device 210, and by having integration processes of the first semiconductor device 210 and the second semiconductor device 220 implemented while curing is performed, the first semiconductor device 210 and the second semiconductor device 220 are firmly integrated in the deformable film 300. In this case, the second semiconductor device may be embedded at a position where the embedding pattern is located or a position adjacent thereto, however, according to a semiconductor device to be finally delivered, additional embedding processes may be performed regardless of the embedding pattern.

As described above, according to FIG. 1 and FIG. 2, the semiconductor device 200 formed on the source substrate 100 may be entirely integrated into the deformable film 300; however, according to FIG. 3, depending on needs, the semiconductor device (the first semiconductor) 200 to be integrated into the deformable film 300 among the semiconductor devices 200 formed on the source substrate 100 may be selectively specified. The semiconductor devices may be a same type of semiconductor devices, but may also be different types of semiconductor devices or have different production-bases.

In addition, according to FIG. 4, semiconductor devices 200 (the second semiconductor 220) of different types or different production-bases may be embedded in the embedding pattern 320, and thus, the first semiconductor device 210 and the second semiconductor device 220 may be respectively embedded in certain regions and integrated into the deformable film 300.

The integrated semiconductor device 200 may be integrated into a same type, embedded in different types, or integrated as the semiconductor devices 200 having different production-bases on the entire portion or a portion of the deformable film 300, or in or on the surface of the deformable film 300.

For example, a green micro LED as the first semiconductor 210 may be integrated into a certain region of the deformable film 300, or a green micro LED, a blue micro LED (the second semiconductor device 220), and a red micro LED (a third semiconductor device) may be integrated into another region of the deformable film 300.

In addition, as the first semiconductor device 210, a semiconductor device, a transistor, a solar battery, a sensor and the like having different production-bases other than the micro LEDs may be integrated into a certain region of the deformable film.

Furthermore, when the semiconductor device 200 is embedded, an embedding depth may be adjusted by adjusting pressure according to the type of the semiconductor device 200, and it is preferable to adjust adhesion between the target substrate 400 and the semiconductor device 200 delivered thereto, according to the embedding depth.

That is, the greater the embedding depth is, the more the adhesion between the target substrate 400 and the semiconductor device 200 is increased to facilitate the delivery of the semiconductor device 200 to the target substrate 400.

Then, in a state where the transfer object is embedded in the deformable film 300, the semiconductor device 200 to be transferred is separated from the source substrate 100, the semiconductor device 200 is integrated into or on the surface of the deformable film 300, and the deformable film 300, into which the semiconductor device 200 is integrated, is separated from the source substrate 100.(a fourth process)

"Integration" in the inventive concept indicates a state in which the transfer object is separated from the source substrate and fixed in or on the surface of the deformable film, and in this state, the delivery of the transfer object to the source substrate 100 is performed.

When the deformable film 300 is formed on the support substrate 310, the deformable film 300 is separated from the source substrate 100 while grabbing the support substrate 310, and when the deformable film 300 is separately formed, the deformable film 300 is separated from the source substrate 100 by peeling. For convenience of peeling, an adhesion member such as an adhesion roller may be provided.

In addition, to facilitate the separation of the source substrate 100 and the deformable film 300, it is desirable to perform an anti-stiction process on a contact surface between the source substrate 100 and the deformable film 300. That is, the anti-stiction process is performed on a surface of the source substrate that contacts the deformable film or a surface of the deformable film that contacts the source substrate.

The anti-stiction process is implemented by coating a material for anti-stiction, or by physical, chemical deposition methods. For example, a vapor method using trichlorosilane such as octadecyl trichlorosilane (OTS), tridecafluoro-1,1,2,2-tetrahydrooctyltrichlorosilane ($CF_3(CF_2)_5(CH_2)_2SiCl_3$, FOTS), hydrocarbon or fluorocarbon-based SAM, a trichlorosilane-based self-assembled monolayer (trichlorosilane-based self-assembled monolayer (SAM)) coating method, and a molecule vapor deposition (MVD) method may be used, but is not limited thereto.

The characteristics of the semiconductor device 200 to be transferred may be implemented by only separating some specified semiconductor devices 200 when separating the semiconductor device 200 from the source substrate 100.

That is, in a state in which the semiconductor device 200 is integrated into the deformable film 300, when the deformable film 300 is separated, it is required that the semiconductor device 200 is separated from the source substrate 100 and may be delivered to the target substrate 400.

In other words, among the semiconductor devices 200 formed on the source substrate 100, on the semiconductor device 200 that is not integrated into the deformable film 300, a protection film 240 surrounding the entire semiconductor device is formed to prevent separation from the source substrate 100 or removal of the sacrificial layer when performing wet etching, such that the semiconductor device 200 is not separated from the source substrate 100.

By doing so, the fourth process of forming the embedding pattern 320 in the deformable film 300 by the non-transferred semiconductor device 200, embedding an additional embedding semiconductor device and an additional integration semiconductor device (a second semiconductor device 220) at a position of the embedding pattern 320 or at a position adjacent thereto, and separating the second semiconductor 220 is performed, and thus, the transfer objects (the first semiconductor device and the second semiconductor device) are integrated on a deformable film. After that, the semiconductor device 200 integrated into the deformable film 300 is delivered to the target substrate 400.(a fifth process)

Likewise, when the embedding pattern 320 is formed by the semiconductor device 200 (the non-transferred semiconductor device) that is not integrated into the deformable film 300, the second through fourth processes are performed to integrate the second semiconductor device 220 at the position of the embedding pattern 320 of the deformable film 300 or a position adjacent thereto, and by repetition of the processes, the second semiconductor device, a third semiconductor device, . . . and an nth semiconductor device (n>2, n is a natural number) are integrated, and the semiconductor devices may be simultaneously delivered to the target substrate 400.

To complete the integration into the deformable film, the separation of the semiconductor device 200 from the source substrate 100 is implemented by the Laser-lift-off or Chemical-lift-off process, and for ease of the separation process, the transfer object is formed in a structure that is separable from the source substrate 100.

The Laser-lift-off method is that the laser irradiated from a back surface of the source substrate 100 provides energy between the source substrate 100 and the semiconductor device 200 to separate the semiconductor device 200 from the source substrate 100.

In other words, the Laser-lift-off method uses a phenomenon as follows: when the source substrate 100 is a transparent sapphire substrate, the substrate 100 is transparent to light (has a band gap which does not absorb light), and the semiconductor device 200 formed of a nitrogen compound and the like is opaque to the light, and the energy is concentrated at a surface of the semiconductor device 200 (between the source substrate 100 and the semiconductor device 200).

In addition, the Chemical lift-off method is used to separate the semiconductor device 200 from the source substrate 100, and this is to separate the source substrate 100 and the semiconductor device 200 from each other by wet etching to separate the semiconductor device 200 from the source substrate 100.

Here, when the Laser-lift-off or Chemical-lift-off process is performed, the sacrificial layer 500 may be formed between the source substrate 100 and the semiconductor device 200 to facilitate performance of the lift-off process.

That is, to increase separability between the source substrate 100 and the semiconductor device 200, the sacrificial layer 500 having high absorption ability for laser energy may be separately formed between the source substrate 100 and the semiconductor device 200, or to increase separability between the source substrate 100 and the semiconductor device 200, the sacrificial layer 500 that has a wet-etching selectivity higher than those of the source substrate 100 and the semiconductor device 200 may be separately formed between the source substrate 100 and the semiconductor device 200.

As an embodiment, an etchant that is capable of selectively removing the sacrificial layer is used in the Chemical-lift-off process, $SiO_2$ or AlAs is used as the sacrificial layer, and hydrofluoric acid or buffered oxide etchant (BOE) is used as the etchant.

As described above, when the transfer object forms the freestanding structure or undercut structure by the anchor 250 through wet etching, the separation process is implemented as the anchor is fractured by physically separating the deformable film, in which the transfer object is integrated, from the source substrate 100.

In other words, as an example embodiment of the inventive concept, the separation process is implemented by the laser-lift-off process or chemical-lift-off process, or by having the anchor fractured by physically separating the deformable film, into which the object is integrated, from the source substrate.

When the semiconductor device 200 is separated from the source substrate 100 as described above, the separated semiconductor device 200 is integrated and fixed in the deformable film 300 or the surface thereof.

Here, the non-transferred semiconductor device 200, which does not irradiate laser, is excluded in the laser-lift-off process (FIGS. 1 and 2), or is excluded in wet etching by having the protection film 240, which has resistance to wet etching, surround the semiconductor device 200.

Then, the deformable film 300, into which the semiconductor device 200 is integrated, is separated from the source substrate 100 and delivered to the target substrate 400.(a fifth process)

According to the purpose or use of the semiconductor device 200, the target substrate 400 may include any one of a semiconductor substrate, a polymer substrate, glass, metal, paper and an insulator, may include an organic or inorganic substrate, a rigid or flexible substrate, a thin film deposited on the rigid substrate, or may include a film and liquid reagent cured through synthesis and heat treatment. Intermediate curing may be performed by using light or heat, and full curing may be performed after the transfer is completed.

As an example embodiment, the target substrate 400 may be directly formed by spin-coating and heat treatment with a material of a flexible substrate such as polyethylene terephthalate (PET), polydimethylsiloxane (PDMS), or polyimide (PI), or when the target substrate 400 that is of a film-type or having rigidity is prepared, an adhesive layer and adhesive force may be generated by spin-coating resin and the like for forming the adhesive layer 410 on an upper portion of the deformable film 300, into which the object is integrated, and then laminating the target substrate 400 and performing heat treatment thereon.

That is, according to types, the target substrate 400 is formed by being coated or laminated on the deformable film 300 into which the semiconductor device 200 is integrated, and according to needs, the adhesive layer 410 may be formed on an entire (FIG. 2) or a partial region (see FIG. 9) on the target substrate 400 or a delivery surface of the object 200.

The adhesion layer 410 may be formed on the entire surface of the target substrate 400 or the entire delivery surface of the object, and may also be formed or perform an adhesion process to a region of the semiconductor 200 to be transferred, that is, not only to the delivery surface of the semiconductor device 200 of the target substrate 400 but also to the delivery surface of the semiconductor 200, and provide adhesion.

Forming of the adhesive layer 410 or adhesion treatment is performed with a greater adhesive force than the adhesive force of the semiconductor device 200 integrated into the deformable film 300, such that the semiconductor device 200 integrated into the deformable film 300 may be easily transferred.

When the target substrate 400 includes a material that may be cured by heat or light, the adhesion treatment may be implemented by having the target substrate 400 have greater adhesive force than the adhesive force of the semiconductor device 200 integrated with the deformable film 300 by maintaining the degree of curing of the target substrate 400 harder than the degree of curing of the deformable film 300, or by forming a separate adhesive layer 410 on the delivery surface of the semiconductor device 200 on the target substrate 400.

The adhesive layer 410 coats the delivery surface of the semiconductor device 200 with an adhesion promoter resin such as polyimide or photo resist (PR), and SU-8 such that the integrated semiconductor device 200 is efficiently delivered to the target substrate 400.

As described above, according to inventive concept, the semiconductor devices 200 of various kinds or having various production-bases may be embedded in the deformable film 300, simultaneously, selectively, or sequentially integrated into or on the surface of the deformable film 300, and may be simultaneously delivered to the target substrate 400, and thus, processes may be significantly simplified.

After the fifth process, on the target substrate 400 to which the semiconductor device 200 is transferred, a passivation layer 420 may be further formed. The passivation layer 420 may be formed of a same material as that of the target substrate 400, or may be formed of a material for insulation and protection (an oxide film, an insulating film or a polymer film) of the semiconductor device 200, and may be formed by laminating or coating on an upper layer of the target substrate 400.

As the formation of the passivation layer 420 is complete, a process of forming an electrode 700 for driving or connection with an external circuit of the semiconductor device 200 transferred on the target substrate to complete electric, electronic devices suitable for the final use or purpose.

Hereinafter, another example embodiment of the inventive concept will be described.

FIG. 6 is a mimetic diagram of a process of transferring only the semiconductor devices 200 in a specific region, among the same kind of semiconductor devices, to the target substrate 400, according to an example embodiment of the inventive concept.

Figure 5:
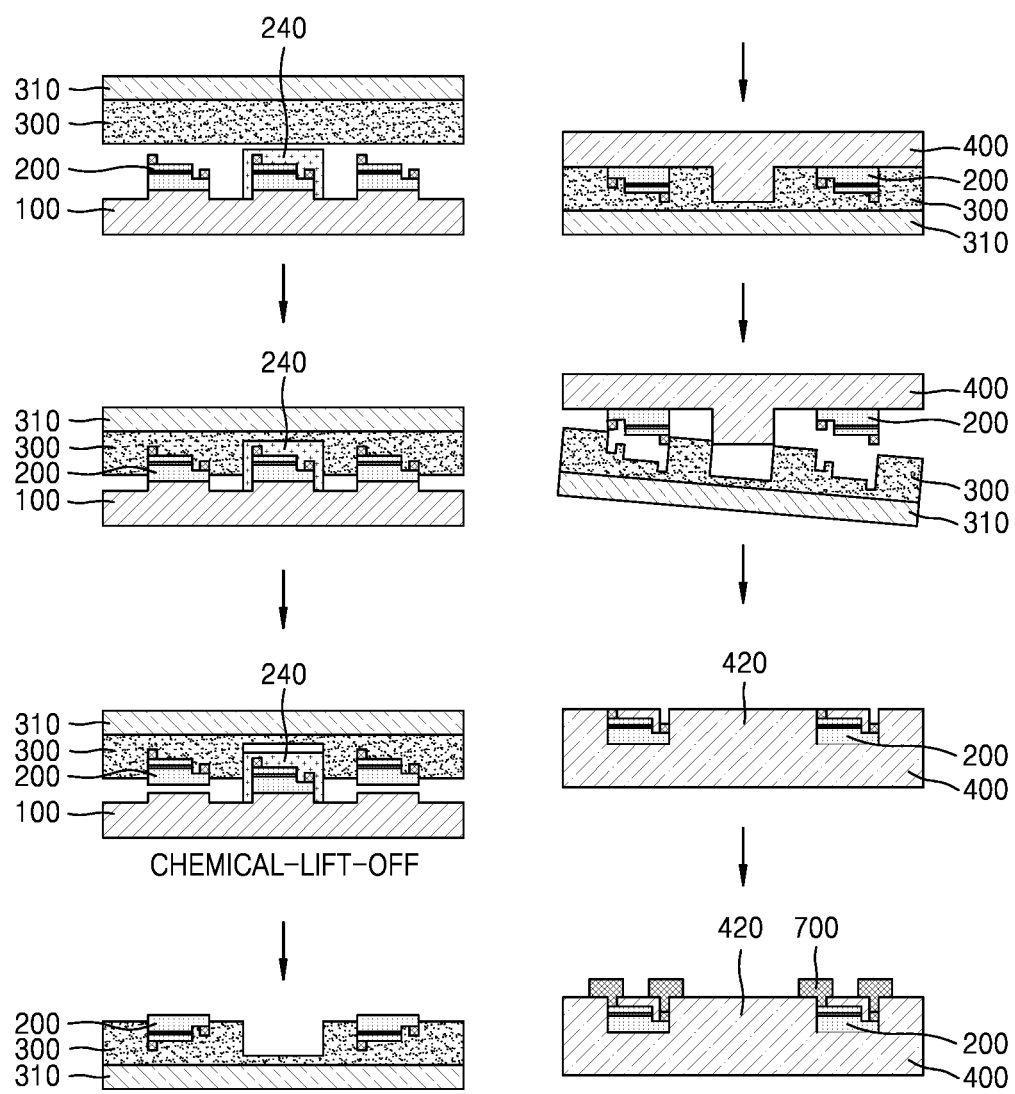

In a first block image shown in FIG. 6, the sacrificial layer 500 is formed between the semiconductor device 200 and the source substrate 100, from which the semiconductor device 200 is separated, the semiconductor device 200 to be transferred is in a state of being fixed to the source substrate 100 by the anchor 250, and the non-transferred semiconductor device is surrounded by the protection film 240 (FIG. 5 shows a case in which the protection film 240 is formed on the non-transferred semiconductor device without the configuration of the anchor).

As the sacrificial layer 500 is removed by wet etching, the semiconductor device surrounded by the protection film 240 is maintained surrounded, and the semiconductor device 200 fixed by the anchor 250 forms the freestanding structure or undercut structure. Therefore, the semiconductor device 200 to be transferred is physically separated from the source substrate 100 but is maintained temporarily fixed by the anchor 250 (a second block image).

Next, by separating the deformable film 300 from the source substrate 100 by a constant force, the semiconductor device 200 to be transferred is integrated into the deformable film 300 (third and fourth block images). Here, the embedding pattern formed by the semiconductor device surrounded by the protection film 240 is also formed in the deformable film 300.

The adhesive layer 410 is formed on the target substrate 400 or the delivery surface of the semiconductor device 200 by laminating (a) or coating (b), and the semiconductor device 200 integrated into the deformable film 300 is delivered and transferred to the target substrate 400.(fifth to seventh block images)

As a following process, on the target substrate 400 to which the semiconductor device 200 is transferred, the passivation layer 420 is further formed, and the electrode (700) forming process for driving the semiconductor device 200 transferred to the target substrate 400 or connection with an external circuit is further performed, and by doing so, electric and electronic devices for the final use or purpose are manufactured.

Figure 7:
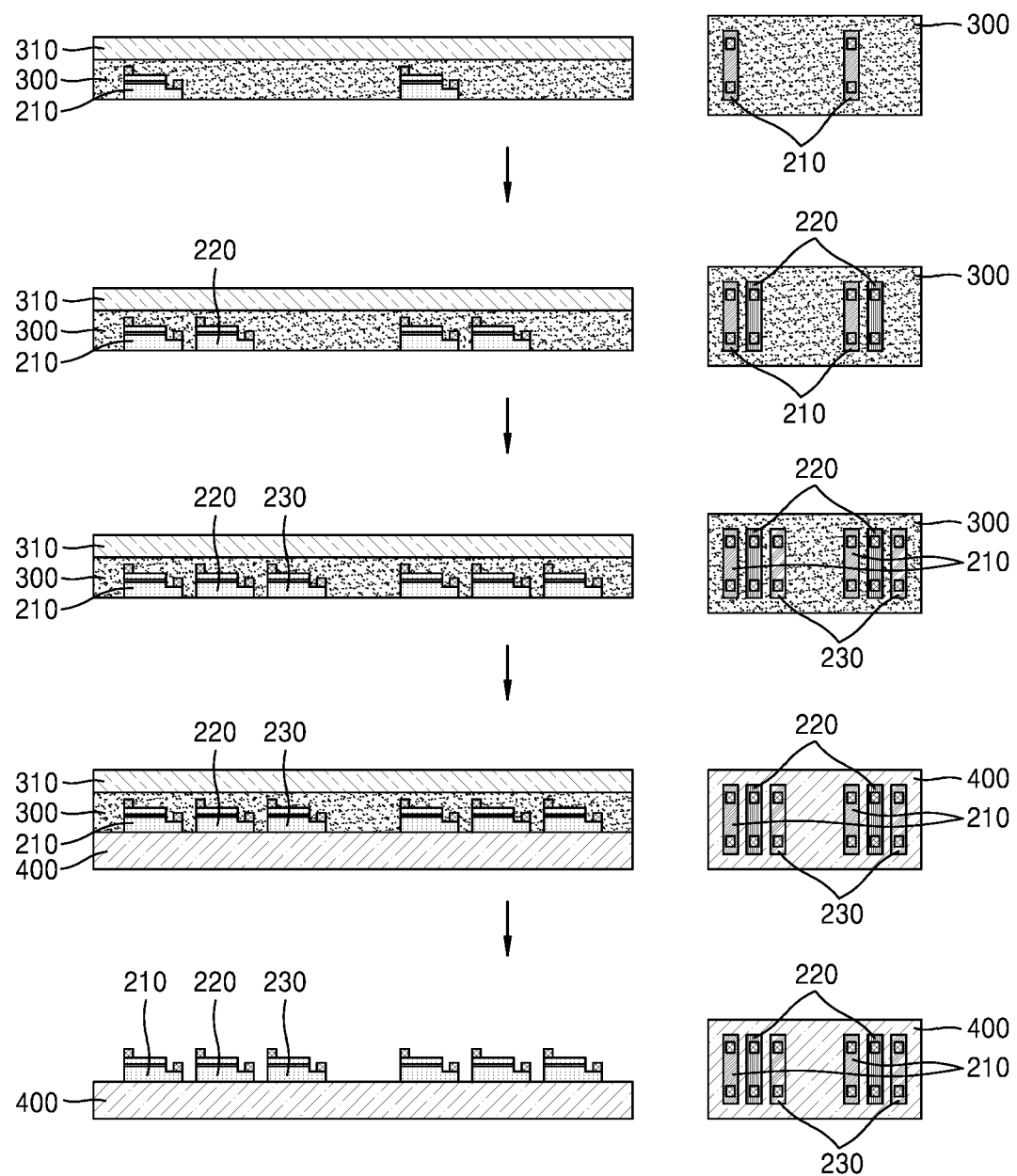

FIG. 7 is a mimetic diagram of a process of transferring the semiconductor device 200 of another type to the target substrate 400, according to an example embodiment of the inventive concept.

In a first block image shown in FIG. 7, the semiconductor device (the first semiconductor device 210) is formed on the source substrate 100, the deformable film 300 is placed on the source substrate 100 on which the semiconductor device (the first semiconductor device) is formed, and the semiconductor device (the first semiconductor device 210) is integrated at a specific position of a specific region in the deformable film 300.

In addition, deformable films 300, in which three different types of semiconductor devices are respectively integrated, are manufactured by sequentially integrating the second semiconductor device 220 and the third semiconductor device 230 at specific positions of the deformable film, the position of the embedding pattern, or a position adjacent thereto.(second to third block images)

In the present embodiment, the first semiconductor device 210 represents a red micro LED, the second semiconductor device 220 indicates a green micro LED, and the third semiconductor device 230 indicates a blue micro LED.

Next, the transfer process is completed by laminating the deformable film 300, in which the semiconductor devices 200 are integrated on the PET, as the target substrate 400, and delivering the semiconductor devices 200 integrated into the deformable film 300 to the target substrate 400. (fourth to fifth block images)

A completed result provides a semiconductor device apparatus in which a plurality of R, G, and B micro LED arrays are formed.

Figure 8:
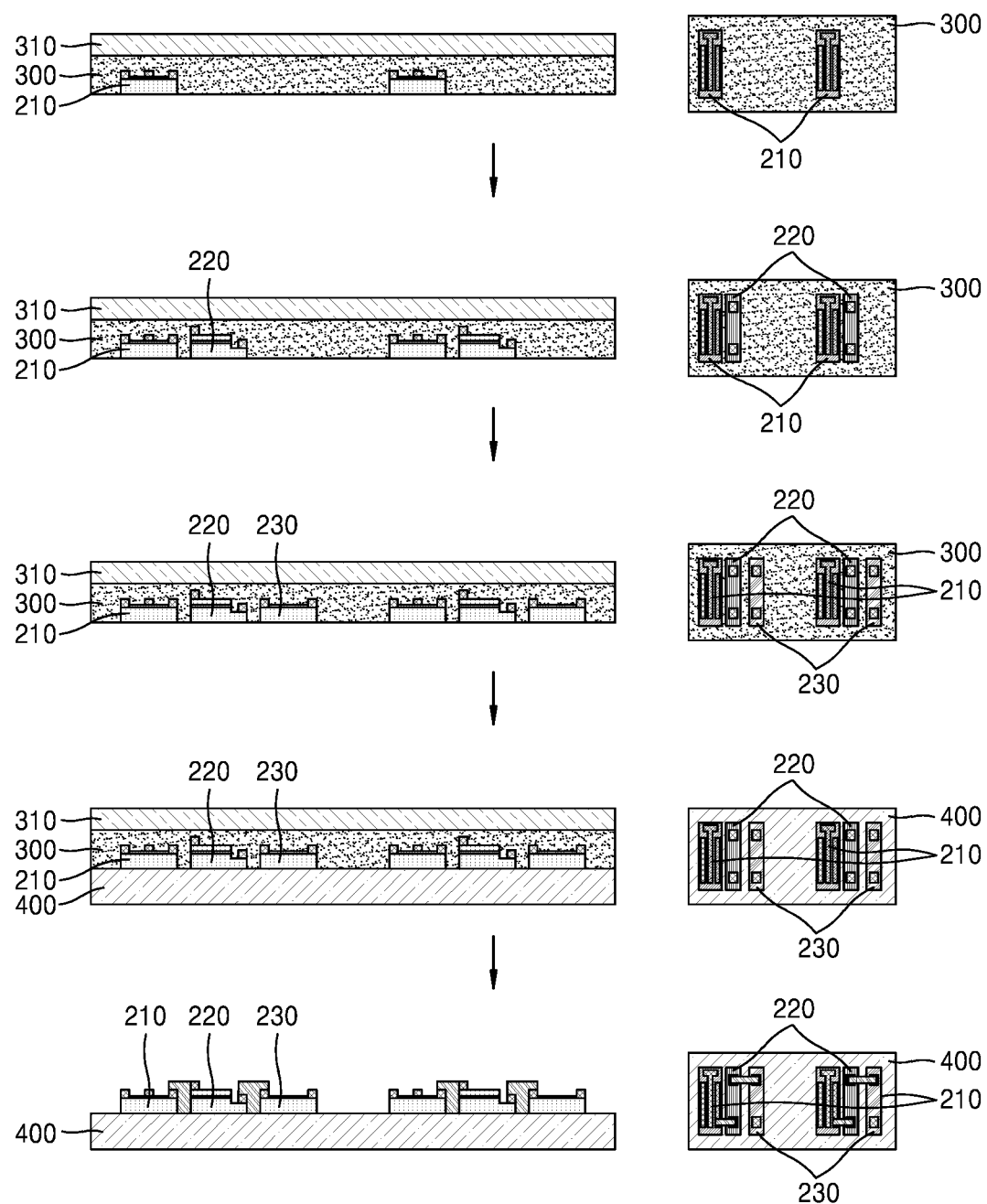

FIG. 8 is a mimetic diagram of a process of transferring the semiconductor device 200 having another production-base to the target substrate 400, according to an example embodiment of the inventive concept.

The transfer process is completed by integrating three types of different semiconductor devices 210, 220, and 230 having different production-bases (for example, having different materials, forms, sizes and shapes) and delivering the semiconductor devices 210, 220, and 230 to the target substrate 400. In this case, when additional semiconductor devices are embedded and integrated into a specific position, a position of the embedding pattern position, or a position adjacent thereto of the deformable film 300, as the deformable film 300 is deformed to correspond to the shape of the additional semiconductor devices, the embedding and integration processes are performed.

In other words, when the second semiconductor device and the third semiconductor device are not integrated to correspond to the positions of the embedding patterns and the second semiconductor device and the third semiconductor device are different types (for example, having different shapes) of semiconductor devices, different types of semiconductors may be embedded in the embedding patterns or regions other than the embedding patterns by using a thermoplastic deformable film, and thus, semiconductor devices are integrated.

A final result provides a semiconductor device apparatus in which a plurality of micro LEDs and TFT arrays are formed.

Figure 9:
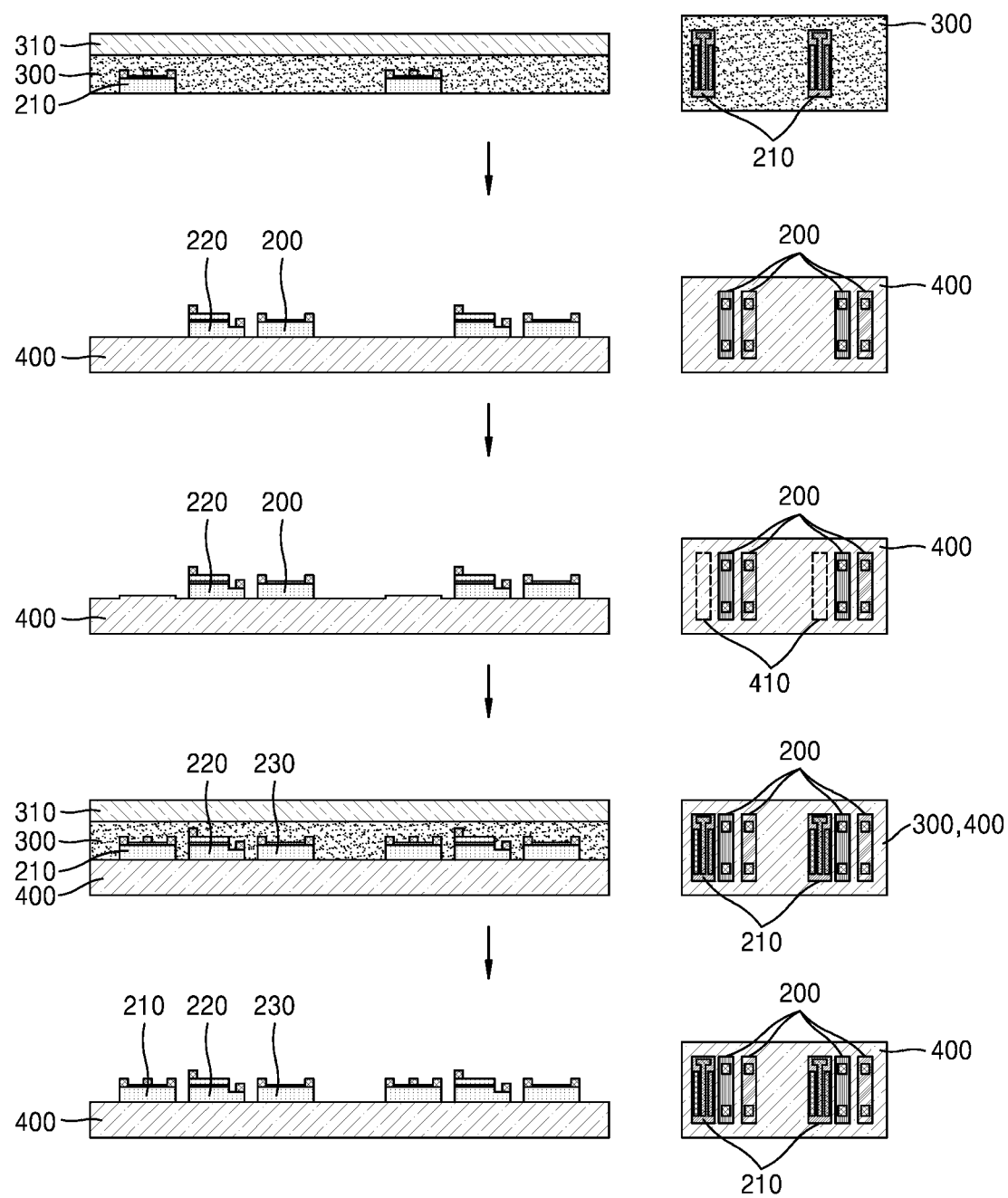

FIG. 9 is a mimetic diagram of a process of transferring semiconductor devices 200 and 210, which have different production-bases, to the target substrate 400, according to an example embodiment of the inventive concept.

In a state in which the TFT is integrated into the deformable film 300 and the micro LED is formed on the target substrate 400, the adhesive layer 410 is formed on a TFT delivery surface of the target substrate 400 to receive the TFT in the deformable film 300, such that the TFT is transferred.

A final result provides a semiconductor device apparatus in which a plurality of micro LEDs and TFT arrays are formed.

Figure 10:
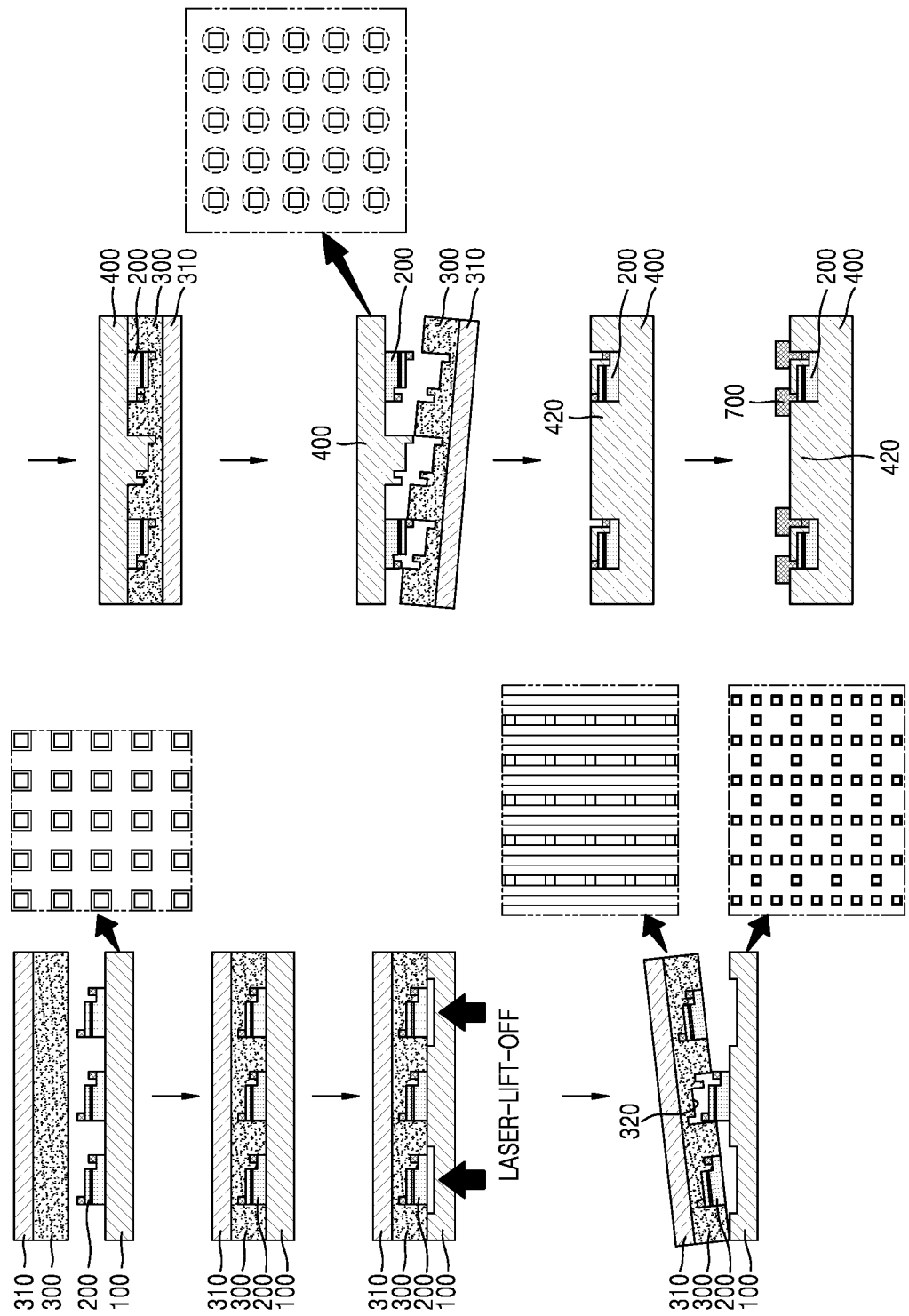
Figure 11:
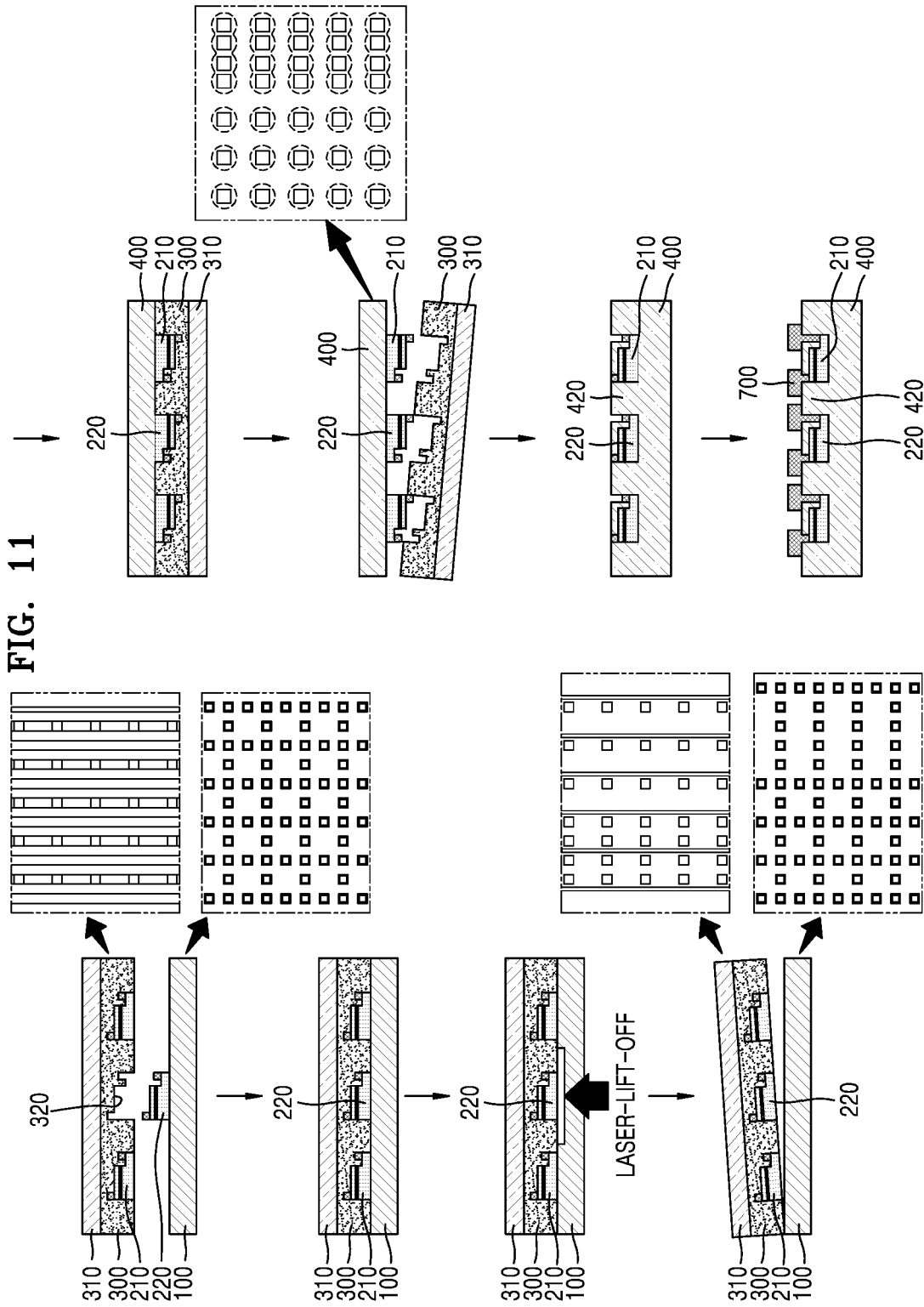

FIG. 10 and FIG. 11 respectively show pictures of the source substrate 100, the deformable film 300, and the target substrate 400 in the embodiments according to FIG. 3 and FIG. 4.

As described above, the inventive concept relates to a method of transferring the object formed on the source substrate to the target substrate, and by using the deformable film, the object is embedded and integrated in the deformable film, and delivered to the target substrate. As the method does not require a bonding process and separation process on a separate temporary substrate, processes are simplified, and the cost and time of processes are reduced.

In addition, objects of different kinds or different production-bases may be easily transferred to the target substrate, only specific objects or an array of specific objects may be selected and transferred to the target substrate, and therefore, the inventive concept may be applied to various fields.

In particular, by being integrated into the deformable film and transferred to the target substrate, the object may be quickly and accurately transferred to the target substrate and may be quickly delivered without being damaged, and therefore, the method may be very effectively applied to mass-transfer of a micro semiconductor device such as a micro LED array and is expected to contribute to the application fields and expand commercialization.

The invention claimed is:

1. A transfer method using a deformable film, the transfer method comprising:
   a first process of forming an object directly on a source substrate that is a growth substrate for growing the object;
   a second process of placing a deformable film on the source substrate on which the object is formed;
   a third process of embedding the object into the deformable film;
   a fourth process of separating from the source substrate a transferred object that is embedded on the deformable film, wherein the fourth process further comprises:
      separating the transferred object from the source substrate by a Laser-lift-off method or a Chemical-lift-off-method;
   a fifth process of placing the transferred object to a target substrate, the fifth process further comprising coating or laminating the target substrate on the deformable film such that the target substrate contacts the deformable film and the transferred object; and
   the transfer method further comprising performing an anti-stiction process on a contact surface between the source substrate and the deformable film.

2. The transfer method of claim 1, further comprising deforming the deformable film by applying light, heat, or pressure, wherein the deformable film is formed of a material allowing control on a degree of deformation or a deformation frequency.

3. The transfer method of claim 2, wherein the first process further comprises forming a plurality of objects on the source substrate; and
   the third process further comprises selectively specifying one or more objects among the plurality of objects to be transferred from the source substrate.

4. The transfer method of claim 3, wherein the third process further comprises selectively specifying a first transferred object;
   further comprising:
   after embedding the first transferred object on the deformable film:
      repeating the second process through the fourth process; and
      additionally embedding additional transferred objects in the deformable film where the first transferred object is embedded,
   the additional transferred objects comprising a second transferred object, a third transferred object, and an $n^{th}$ transferred object, where n is a natural number greater than zero; and
   wherein additionally embedding further comprises:
      additionally embedding the second transferred object, the third transferred object, and the $n^{th}$ transferred object at different positions respectively.

5. The transfer method of claim 4, wherein deforming the deformable film further comprises deforming the deformable film to correspond to a shape of one or more additional transferred objects in the additional embedding process.

6. The transfer method of claim 4, further comprising:
forming an embedding pattern in the deformable film by a non-transferred object; and
embedding said one or more additional transferred objects at a position adjacent to the embedding pattern.

7. The transfer method of claim 4, further comprising:
forming embedding patterns corresponding to the second, the third and the $n^{th}$ transferred objects in the deformable film; and
deforming the embedding patterns, in the additional embedding process, to correspond to forms of the additional transferred objects.

8. The transfer method of claim 4, wherein the additional transferred object includes a plurality of additional transferred objects, and the additional transferred objects are identical.

9. The transfer method of claim 4, wherein the additional transferred objects are embedded into the deformable film in an array form.

10. The transfer method of claim 1, further comprising:
forming a protection film having resistance to wet etching and surrounding a non-transferred object on the source substrate.

11. The transfer method of claim 1, further comprising:
removing a non-transferred object with the Laser-lift-off method.

12. The transfer method of claim 4, wherein the additional transferred objects are different from one another in size, material, function, or shape.

13. The transfer method of claim 1, further comprising forming a sacrificial layer between the object and the source substrate.

14. The transfer method of claim 13,
wherein the first process includes forming a plurality of objects on the source substrate;
further comprising:
fixing a portion of the transferred object among the plurality of objects to the source substrate by an anchor; and
forming, with the transferred object, a freestanding structure or an undercut structure to the source substrate by wet etching.

15. The transfer method of claim 1, wherein the object comprises an electronic device, an optical device, a sensor device, a diode, a transistor, a photovoltaic device, a laser, a P-N junction, a nano device, an MEMS device, a nano material, a quantum dot, a nano line, or a combination thereof, and the object is provided in the form of an array thereof.

16. The transfer method of claim 1, wherein the third process further comprises adjusting an embedding depth by adjusting pressure applied to the object at the time of embedding.

17. The transfer method of claim 16, wherein the third process further comprises adjusting an adhesion between the target substrate and the transferred object delivered thereto according to the embedding depth.

18. The transfer method of claim 1, wherein the frist first process includes forming a plurality of objects on the source substrate, and further comprising forming the deformable film on a support substrate and placed on the source substrate.

19. The transfer method of claim 1, wherein the target substrate comprises at least one of a semiconductor substrate, a polymer substrate, glass, metal, paper, and an insulator.

20. The transfer method of claim 1, wherein the first process includes forming a plurality of objects on the source substrate, and further comprising forming the deformable film by laminating or coating on the source substrate.

21. The transfer method of claim 1, further comprising forming an adhesion layer on the target substrate or a delivery surface of the transferred object.

22. The transfer method of claim 1, further comprising:
after the fifth process, forming a passivation layer on the target substrate onto which the transferred object has been transferred.

23. The transfer method of claim 1, further comprising performing an electrode forming process for driving the transferred object on the target substrate or connecting with an external circuit.

* * * * *